United States Patent
Chen et al.

(10) Patent No.: US 10,881,203 B2
(45) Date of Patent: *Jan. 5, 2021

(54) SLIDE RAIL ASSEMBLY AND BRACKET DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/929,138

(22) Filed: Jul. 15, 2020

(65) Prior Publication Data
US 2020/0345138 A1 Nov. 5, 2020

Related U.S. Application Data

(63) Continuation of application No. 16/134,948, filed on Sep. 18, 2018, now Pat. No. 10,765,207.

(30) Foreign Application Priority Data

Mar. 8, 2018 (TW) .............................. 107108198 A (51) Int. Cl.
A47B 96/06 (2006.01)
A47B 88/43 (2017.01)
(Continued)

(52) U.S. Cl.
CPC ............ *A47B 88/43* (2017.01); *A47B 57/485* (2013.01); *A47B 88/407* (2017.01)

(58) Field of Classification Search
CPC ...... H05K 7/1489; H05K 7/183; A47B 88/43; A47B 88/423
See application file for complete search history.

(56) References Cited

U.S. PATENT DOCUMENTS 7,357,362 B2 4/2008 Yang
8,371,454 B2 2/2013 Chen
(Continued)

FOREIGN PATENT DOCUMENTS

EP 3 136 830 A2 3/2017
JP 2017-23685 A 2/2017
(Continued)

*Primary Examiner* — Bradley Duckworth
(74) *Attorney, Agent, or Firm* — Winston Hsu (57) ABSTRACT

A bracket device of a slide rail assembly comprises a supporting frame, a bracket, and a fastening member. The bracket comprises a longitudinal wall and a mounting member. The longitudinal wall is connected to the supporting frame. The mounting member is adjacent to the longitudinal wall. The fastening member is pivotally connected relative to the bracket. When the fastening member is rotated in a first direction from a predetermined state, a fastening section of the fastening member moves away from the mounting member. The bracket device further comprises at least one blocking feature arranged on a rotation path of the fastening member in a second direction. When the fastening member is in the predetermined state, the blocking feature is disposed beside the fastening member to prevent the fastening member from being rotated in the second direction from the predetermined state.

6 Claims, 7 Drawing Sheets

(51) Int. Cl.
    *A47B 57/48*      (2006.01)
    *A47B 88/407*     (2017.01)

(56) References Cited

U.S. PATENT DOCUMENTS

| | | |
|---|---|---|
| 9,237,808 B2 | 1/2016 | Chen |
| 9,279,451 B2 | 3/2016 | Judge |
| 9,629,460 B1 | 4/2017 | Chen |
| 9,854,911 B1 | 1/2018 | Chang |
| 9,986,828 B2 | 6/2018 | Chen |
| 10,021,977 B2 | 7/2018 | Chen |
| 10,085,561 B2 | 10/2018 | Chen |
| 10,172,458 B2 | 1/2019 | Chen |
| 10,278,498 B2 | 5/2019 | Chen |
| 10,292,297 B2 | 5/2019 | Chen |
| 10,306,983 B2 | 6/2019 | Chen |
| 10,349,741 B2 | 7/2019 | Chen |
| 10,357,105 B2 | 7/2019 | Chen |
| 2015/0069196 A1 | 3/2015 | Chen |
| 2016/0286683 A1 | 9/2016 | Chen |
| 2017/0013959 A1 | 1/2017 | Chen |
| 2017/0079427 A1 | 3/2017 | Chen |
| 2017/0354055 A1 | 12/2017 | Hsu |
| 2018/0360215 A1 | 12/2018 | Chen |

FOREIGN PATENT DOCUMENTS

| | | |
|---|---|---|
| JP | 2017-59803 A | 3/2017 |
| JP | 2017-224800 A | 12/2017 |

SLIDE RAIL ASSEMBLY AND BRACKET DEVICE THEREOF

CROSS REFERENCE TO RELATED APPLICATIONS

This application is a continuation application of U.S. application Ser. No. 16/134,948, filed on Sep. 18, 2018. This application claims the benefit of U.S. application Ser. No. 16/134,948, which was filed on Sep. 18, 2018, and is incorporated herein by reference.

BACKGROUND OF THE INVENTION

1. Field of the Invention

The present invention relates to a slide rail assembly and a bracket device thereof, and more particularly, to a design that prevents a fastening member of the bracket device from moving in an unspecified direction from a predetermined state.

2. Description of the Prior Art

Figure 1:
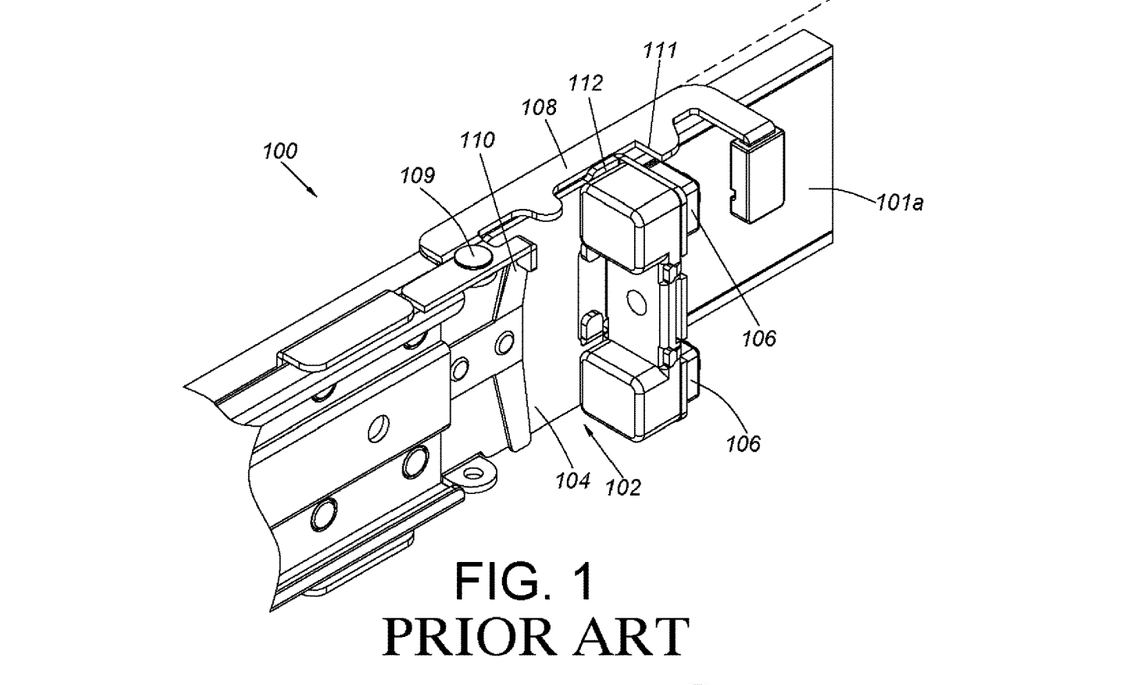
FIG. 1 is a diagram illustrating a slide rail assembly and a bracket device in the prior art.
Figure 2:
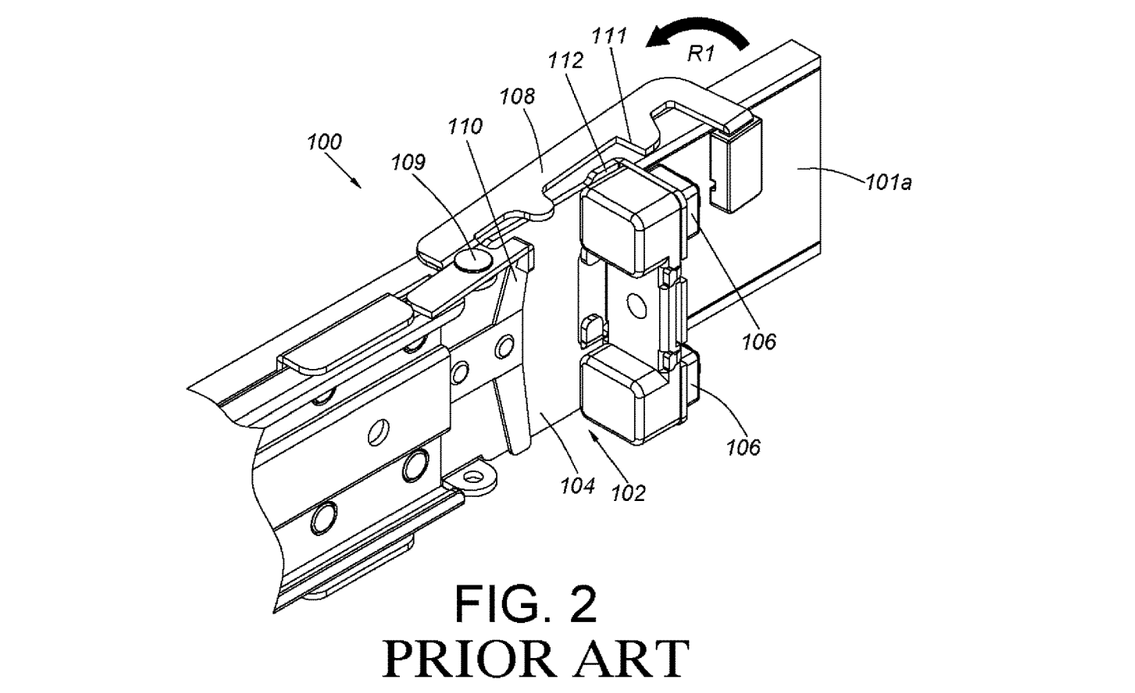
FIG. 2 is a diagram illustrating a fastening member of the bracket device in the prior art rotating in a first direction.

As shown in FIG. 1 and FIG. 2, a slide rail assembly 100 comprises a fixed rail 101a, a movable rail 101b (also shown in FIG. 3 and FIG. 4), and a bracket device 102 that can be used to mount the slide rail assembly 100 to a post of a rack. Here, the bracket device 102 comprises a bracket 104, at least one mounting member 106, and a fastening member 108. The at least one of mounting member 106 can be mounted on the post of the aforementioned rack, and the fastening member 108 is pivotally connected to the bracket 104 through a pin 109. The fastening member 108 can be maintained at a predetermined position P through the elastic force of an elastic member 110. When the fastening member 108 is at the predetermined position P (as shown in FIG. 1), a fastening section 111 of the fastening member 108 can be used to lock the post of the aforementioned rack. More specifically, when a force is applied to the fastening member 108, the fastening member 108 can rotate in a first direction R1 and move away from the predetermined position P (as shown in FIG. 2). Once the force is no longer applied to the fastening member 108, the fastening member 108 is able to return to the predetermined position P in respond to the elastic force of the elastic member 110. Herein, when the fastening member 108 is at the predetermined position P, the fastening member 108 of an ideal product should substantially not be allowed to rotate in a second direction opposite to the first direction R1. In the current art, an extension wall 112 of the bracket 104 is typically utilized to block and prevent the fastening member 108 from rotating in the aforementioned second direction.

Figure 3:
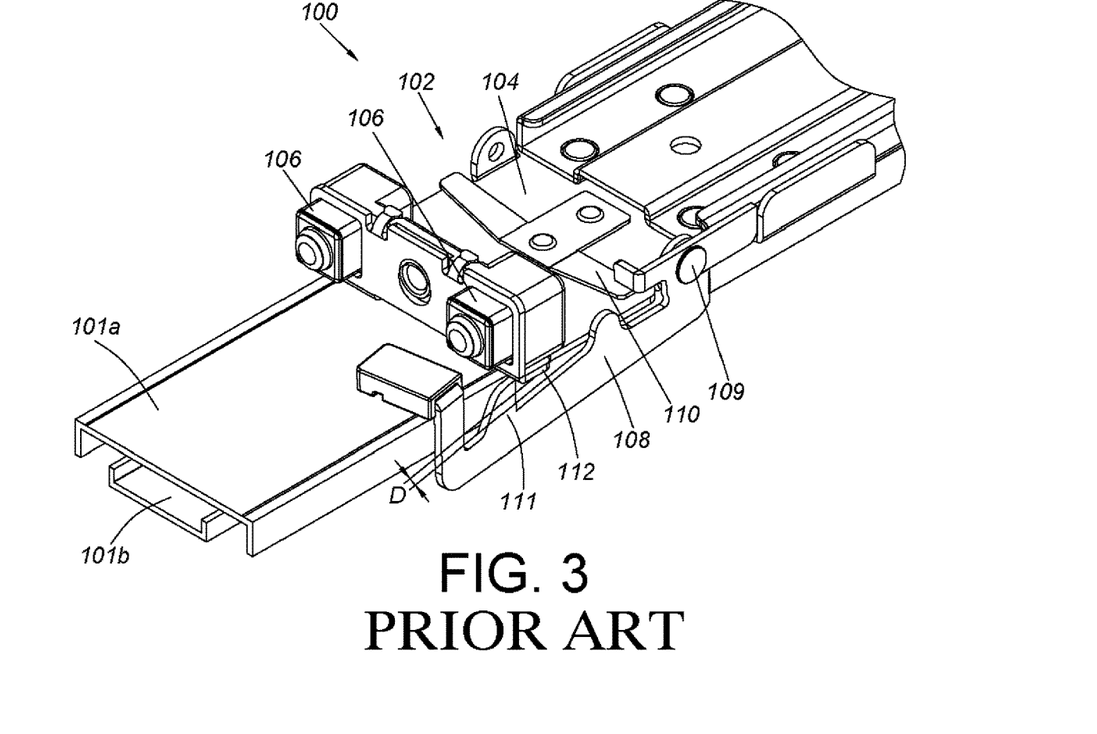
FIG. 3 is a diagram illustrating the fastening member of the bracket device in the prior art being raised a height and not being blocked by a wall.
Figure 4:
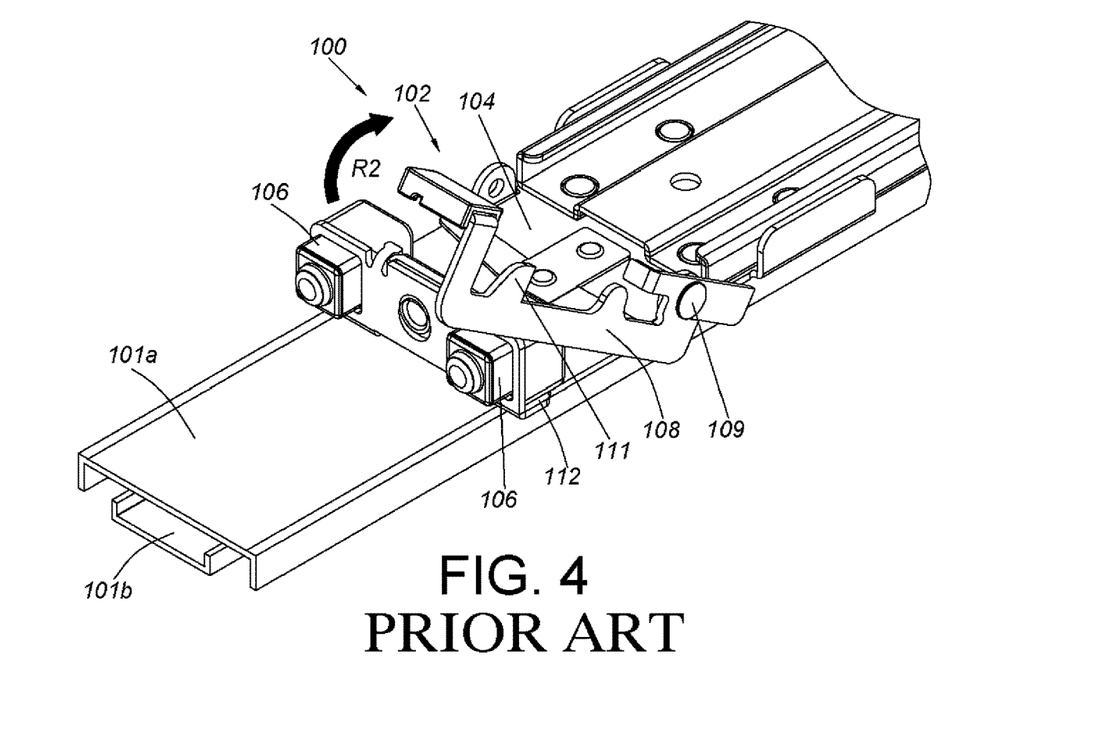
FIG. 4 is a diagram illustrating the fastening member of the bracket device in the prior art not being blocked by the wall and rotated in a second direction.

However, as shown in FIG. 3 and FIG. 4, the tolerance between the fastening member 108 and the pin 109 or an inappropriately applied external force may occasionally cause the fastening member 108 to be raised a height D relative to the pin 109. Such an issue may result in the extension wall 112 being unable to block the rotation of the fastening member 108 in the second direction R2, thereby affecting the quality and usage of the slide rail assembly 100 and the bracket device 102.

SUMMARY OF THE INVENTION

The present invention relates to a design that prevents a fastening member of the bracket device from moving in an unspecified direction from a predetermined state.

According to an embodiment of the present invention, a bracket device comprises a supporting frame, a bracket, a fastening member, and an elastic member. The supporting frame has a first wall, a second wall and a side wall connected between the first wall and the second wall of the supporting frame, wherein the first wall of the supporting frame has a first bending wall. The bracket comprises a longitudinal wall and a mounting member, the longitudinal wall is integrated with the supporting frame, and the bracket is fixedly arranged on the supporting frame. The mounting member is arranged adjacent to the longitudinal wall. The fastening member is movably connected to the bracket; however, the fastening member is unable to be linearly moved relative to the bracket. The fastening member comprises a supporting part, an extension part, and a connecting part. The connecting part is between the supporting part and the extension part, and the connecting part is pivotally connected relative to the bracket through a pin. The extension part comprises a fastening section, and the elastic member is configured to provide an elastic force to the fastening member. When the fastening member is in a predetermined state, the fastening section is adjacent to the mounting member. When the fastening member is rotated in a first direction from the predetermined state, the fastening section moves away from the mounting member. Herein, the bracket device further comprises a blocking feature arranged on a rotation path of the fastening member in a second direction along which the fastening member is rotated. When the fastening member is at the predetermined state, the blocking feature is configured beside the supporting part of the fastening member for preventing the fastening member from rotating in the second direction from the predetermined state. When the fastening member is at the predetermined state, a surface of the first bending wall of the supporting frame is located beside the supporting part of the fastening member.

Preferably, the blocking feature is a wall of the supporting frame or a wall of the bracket.

Preferably, the longitudinal wall of the bracket comprises two lateral sides, and the fastening member is pivoted to one of the two lateral sides.

Preferably, the bracket further comprises an end wall, and when the fastening member is at the predetermined state, the end wall is located between the fastening section and the supporting part.

According to another aspect of the present invention, a bracket device comprises a supporting frame, a bracket, a fastening member, and an elastic member. The bracket comprises a longitudinal wall, an end wall, and a mounting member. The longitudinal wall is integrated with the supporting frame, and the bracket is fixedly arranged on the supporting frame. The mounting member is arranged adjacent to the longitudinal wall. The fastening member is movably connected to the bracket; however, the fastening member is unable to be linearly moved relative to the bracket. The fastening member comprises a supporting part, an extension part, and a connecting part. The connecting part is between the supporting part and the extension part, and the connecting part is pivotally connected relative to the bracket through a pin. The extension part comprises a fastening section, and the elastic member is configured to provide an elastic force to the fastening member. When the fastening member is in a predetermined state, the fastening section is adjacent to the mounting member. When the fastening member is rotated in a first direction from the predetermined state, the fastening section moves away from the mounting member. Herein, the bracket device further comprises a blocking feature arranged on a rotation path of the fastening member in a second direction along which the fastening member is rotated. When the fastening member is at the predetermined state, the blocking feature is configured beside the supporting part of the fastening member for preventing the fastening member from rotating in the second direction from the predetermined state. When the fastening member is at the predetermined state, the end wall is located between the fastening section and the supporting part.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
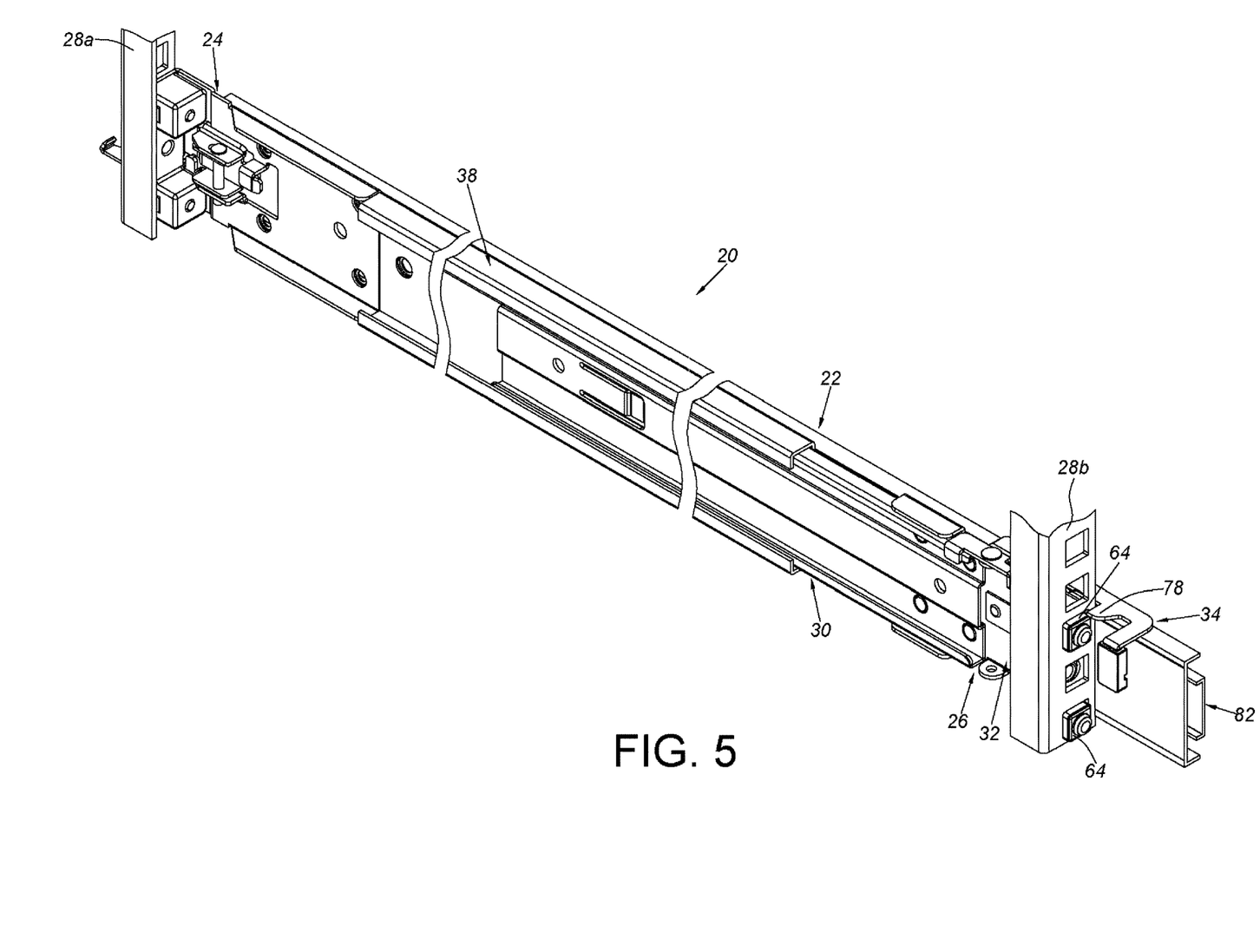
FIG. 5 is a diagram illustrating the slide rail assembly being mounted on a rack through two bracket devices according to an embodiment of the present invention.

As shown in FIG. 5, a slide rail assembly 20 according to an embodiment of the present invention comprises a first rail 22, a first bracket device 24, and a second bracket device 26 (also called a bracket device). A front part and a rear part of the first rail 22 can be mounted to a first post 28a and a second post 28b of a rack through the first bracket device 24 and the second bracket device 26, respectively.

Figure 6:
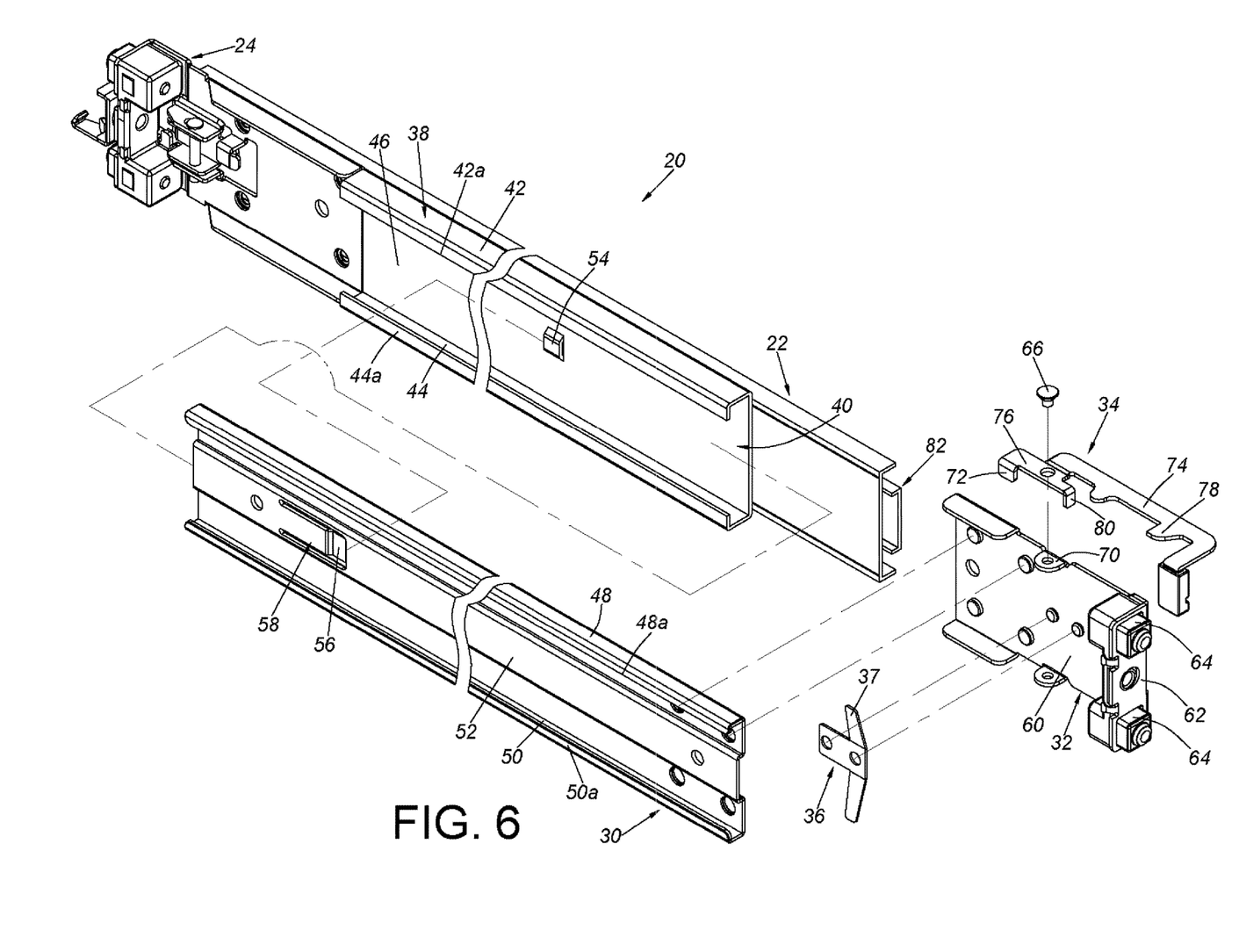
FIG. 6 is an exploded diagram illustrating the slide rail assembly according to the embodiment of the present invention.
Figure 7:
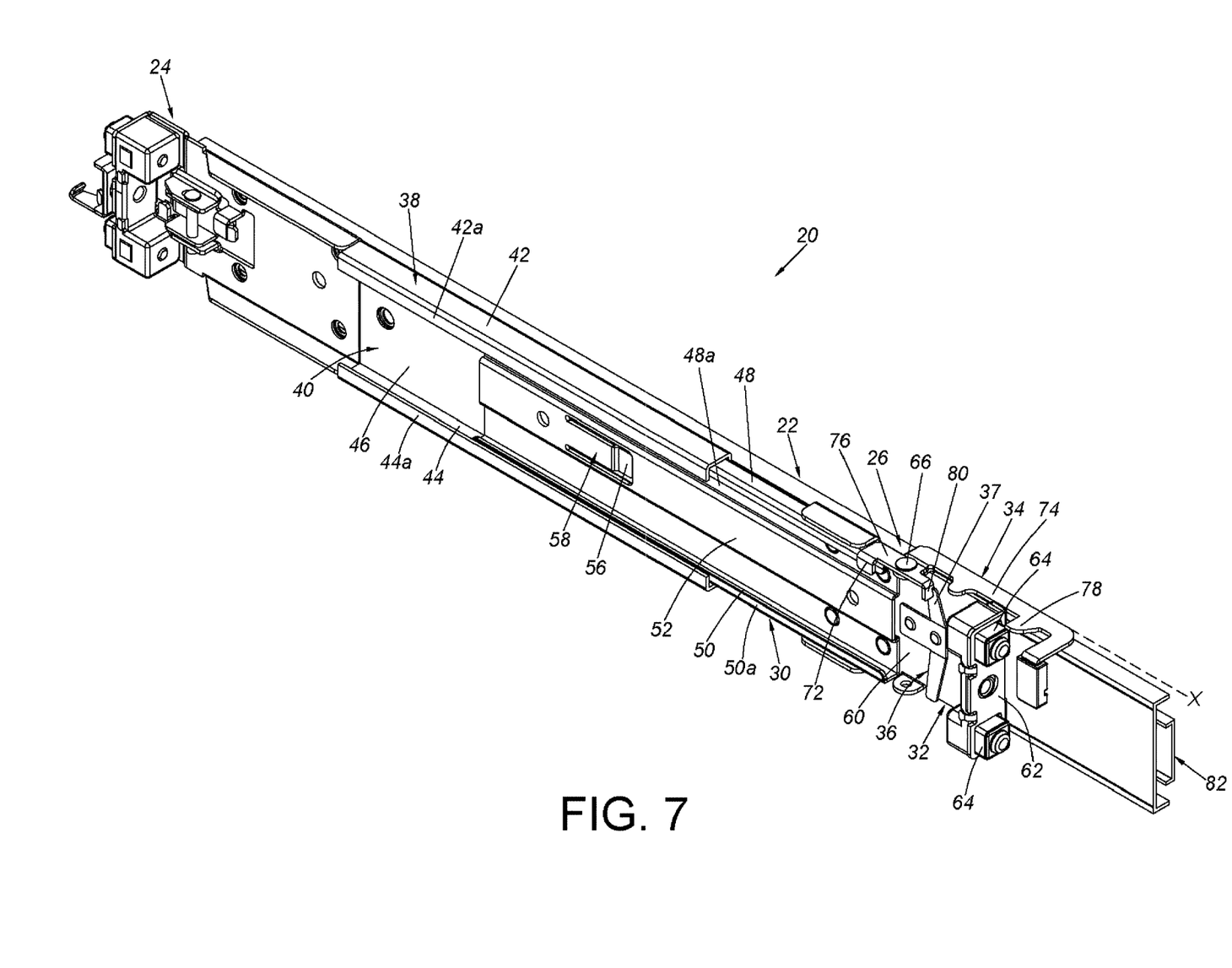
FIG. 7 is a schematic diagram illustrating the slide rail assembly according to the embodiment of the present invention.

As shown in FIG. 6 and FIG. 7, the first bracket device 24 is mounted to the first rail 22. The first bracket device 24 being fixed to the first rail 22 is illustrative of an example hereinafter, but the present invention is not limited thereto. On the other hand, the second bracket device 26 comprises a supporting frame 30, a bracket 32, a fastening member 34, and an elastic member 36.

The supporting frame 30 is movable relative to the first rail 22. Preferably, the slide rail assembly 20 further comprises a mounting base 38 fixed to the first rail 22, and the mounting base 38 can be viewed as a part of the first rail 22. The supporting frame 30 is movable relative to the first fail 22 through the mounting base 38. In practical application, one of the mounting base 38 and the supporting frame 30 has a guiding feature 40, and the supporting frame 30 is displaceable relative to the mounting base 38 through the guiding feature 40. Preferably, the mounting base 38 has a first wall 42, a second wall 44 and a side wall 46 connected between the first wall 42 and the second wall 44 of the mounting base 38. The first wall 42, the second wall 44 and the side wall 46 of the mounting base 38 collectively define a supporting passage as the guiding feature 40. Preferably, the first wall 42 and the second wall 44 of the mounting base 38 have a first bending wall 42a and a second bending wall 44a, respectively. On the other hand, the supporting frame 30 can be mounted to the supporting passage of the mounting base 38, and a structural arrangement of the supporting frame 30 is substantially identical to that of the mounting base 38. That is, the supporting frame 30 has a first wall 48, a second wall 50 and a side wall 52 connected between the first wall 48 and the second wall 50 of the supporting frame 30. Preferably, the first wall 48 and the second wall 50 of the supporting frame 30 have a first bending wall 48a and a second bending wall 50a, respectively. Preferably, the mounting base 38 and the supporting frame 30 have matching limiting structures so that the supporting frame 30 can be displaced in a limited range relative to the mounting base 38. Herein, an example of a first limiting structure 54 of the mounting base 38 is a protrusion or a protruded part. On the other hand, the supporting frame 30 has a second limiting structure 56. When the supporting frame 30 is displaced for a predetermined range relative to the mounting base 38, the supporting frame 30 can abut against the first limiting structure 54 of the mounting base 38 through the second limiting structure 56. Preferably, the supporting frame 30 has a flexible arm 58, and the second limiting structure 56 is disposed on the flexible arm 58. This arrangement can help the second limiting structure 56 of the supporting frame 30 to reach over the first limiting structure 54 via the flexible arm 58 and mount to the mounting base 38, or help the supporting frame 30 to be detached from the mounting base 38.

The bracket 32 is fixedly arranged on the supporting frame 30, and the bracket 32 comprises a longitudinal wall 60, an end wall 62, and at least one mounting member 64. The longitudinal wall 60 is connected to the supporting frame 30. The longitudinal wall 60 being fixed to an end of the side wall 52 of the supporting frame 30 in a riveting or welding manner is illustrative of an example hereinafter, or the longitudinal wall 60 and the supporting frame 30 are integrated with each other. According to the aforementioned configuration, the supporting frame 30 can be viewed as a part of the bracket 32. Specifically, the side wall 52 of the supporting frame 30 can be viewed as an extension in the longitudinal direction of the longitudinal wall 60 of the bracket 32. The end wall 62 is bent relative to the longitudinal wall 60. That is, the end wall 62 is substantially perpendicularly bent from the longitudinal wall 60, and the end wall 62 is adjacent to the longitudinal wall 60. At least one of the mounting members 64 is disposed adjacent to the longitudinal wall 60. At least one of the mounting members 64 being located at the end wall 62 and adjacent to the longitudinal wall 60 is illustrative of an example hereinafter.

The fastening member 34 is movably connected to the bracket 32. Preferably, the fastening member 34 is pivotally connected to the bracket 32 through a pin 66. The longitudinal wall 60 of the bracket 32 having a lug 70 laterally protruding is illustrative of an example hereinafter, and the fastening member 34 is pivotally connected to the lug 70 through the pin 66. It is noted that the fastening member 34 being pivoted to one of two lateral sides of the bracket 32 through the lug 70 is illustrative of an example herein. In this manner, the fastening member 34 is unable to be linearly moved relative to the bracket 32. The fastening member 34 comprises two parts; for example, the two parts are a supporting part 72 and an extension part 74. Preferably, the fastening member 34 further comprises other parts such as a connecting part 76, a fastening section 78 and a supporting leg 80. In practical application, the connecting part 76 is between the supporting part 72 and the extension part 74. Herein, the connecting part 76 is pivotally connected to the bracket 32 through the pin 66, and the pin 66 is between the supporting part 72 and the extension part 74. One of the supporting part 72 and the extension part 74 comprises the fastening section 78. The extension part 74 comprising the fastening section 78 is illustrative of an example hereinafter. Preferably, the supporting part 72 and the supporting leg 80 are disposed adjacent to the two ends of the connecting part 76, whereas the supporting part 72 and the supporting leg 80 are bent relative to the connecting part 76. The extension part 74 is extended for a distance in the longitudinal direction from the connecting part 76, and the fastening section 78 is disposed on the extension part 74. That is, the fastening section 78 transversely protrudes from the extension part 74.

The elastic member 36 is configured to provide an elastic force to the fastening member 34 so that the fastening member 34 can be maintained in a predetermined state X. Preferably, the elastic member 36 is disposed on the longitudinal wall 60 of the bracket 32, and the supporting leg 80 of the fastening member 34 can abut against an elastic part 37 of the elastic member 36. The elastic member 36 can be a flat spring, but the present invention is not limited thereto.

It is worth nothing that the first rail 22 has a first mounting side and a second mounting side opposite to the first mounting side. The first bracket device 24 and the second bracket device 26 is on the first mounting side of the first rail 22. Preferably, the slide rail assembly 20 further comprises a second rail 82 arranged on the second mounting side of the first rail 22.

As shown in FIG. 7, when the fastening member 34 is in the predetermined state X, the fastening section 78 is adjacent to the mounting member 64. In the predetermined state X, the fastening section 78 of the fastening member 34 can be used to lock the second post 28b of the rack (as illustrated in FIG. 5).

Figures 8, 9:
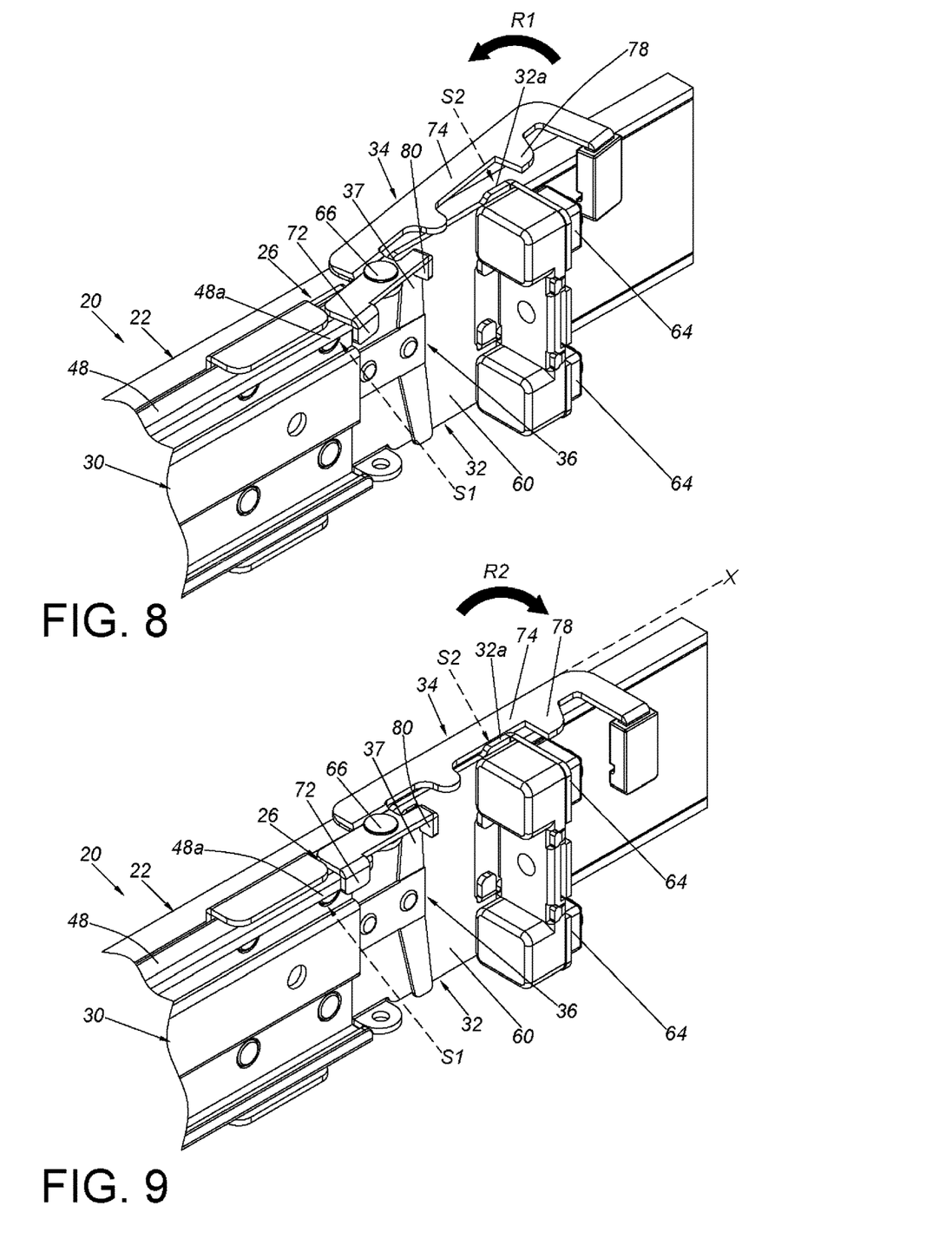
FIG. 8 is a diagram illustrating the fastening member of the bracket device of the slide rail assembly being rotated in a first direction according to the embodiment of the present invention.
FIG. 9 is a diagram illustrating the fastening member of the bracket device of the slide rail assembly in a predetermined state according to the embodiment of the present invention.

As shown in FIG. 8, when the fastening member 34 is rotated from the aforementioned predetermined state X in a first direction R1, the fastening section 78 moves away from the mounting member 64. The supporting leg 80 of the fastening member 34 can press the elastic part 37 of the elastic member 36 so that the elastic part 37 of the elastic member 36 can sustain an elastic force. In other words, the fastening section 78 of the fastening member 34 cannot lock the second post 28b of the aforementioned rack when the fastening member 34 is not in the predetermined state X.

As shown in FIG. 9, when the fastening member 34 is in the predetermined state X in response to the elastic force released by the elastic part 37 of the elastic member 36, the fastening section 78 is adjacent to the mounting member 64.

It is worth noting that the second bracket device 26 further comprises a blocking feature (or a blocking structure) arranged on a rotation path of the fastening member 34 in a second direction R2 which the fastening member 34 is rotated along and opposite to the aforementioned first direction R1. Some embodiments may utilize only one blocking feature; in the present embodiment, two blocking features are illustrative of an example. As another example, one of the two blocking features is a surface of the wall of the supporting frame 30 (such as a surface of the first bending wall 48a of the supporting frame 30, but the present invention is not limited thereto; practically, the aforementioned surface of the wall of the supporting frame 30 can be a surface of the second bending wall 50a of the supporting frame 30; or the aforementioned surface of the wall of the supporting frame 30 can be a surface of the side wall 52); the other of the two blocking features may be a surface of a wall of the bracket 32 (such as a surface of a blocking wall 32a of the longitudinal wall 60, wherein the blocking wall 32a extends a predetermined height from the longitudinal wall 60, but the present invention is not limited thereto). In practical application, the supporting frame 30 and the bracket 32 has a first side S1 and a second side S2, wherein the first side S1 of the supporting frame 30 and the first side S1 of the bracket 32 are located on the same side, the second side S2 of the supporting frame 30 and the second side S2 of the bracket 32 are located on the same side, and the first side S1 and the second side S2 are opposite sides. The two blocking features are disposed on the first side S1 and the second side S2. That is, the surface of the first bending wall 48a of the supporting frame 30 is on the first side S1, and the surface of the blocking wall 32a of the bracket 32 is on the second side S2.

When the fastening member 34 is in the predetermined state X, the two blocking features are disposed beside the two parts (that is, the supporting part 72 and the extension part 74) of the fastening member, and the two blocking features are used to prevent the fastening member 34 from rotating in the second direction R2 from the predetermined state X. For example, when the fastening member 34 is in the predetermined state X, the surface of the first bending wall 48a of the supporting frame 30 is located beside the supporting part 72 of the fastening member 34, and this surface is used for blocking. Furthermore, the surface of the blocking wall 32a of the bracket 32 is located beside the extension part 74 of the fastening member 34, and this surface is used for blocking. This configuration can prevent the fastening member 34 from rotating in the second direction R2 from the predetermined state X.

Figure 10:
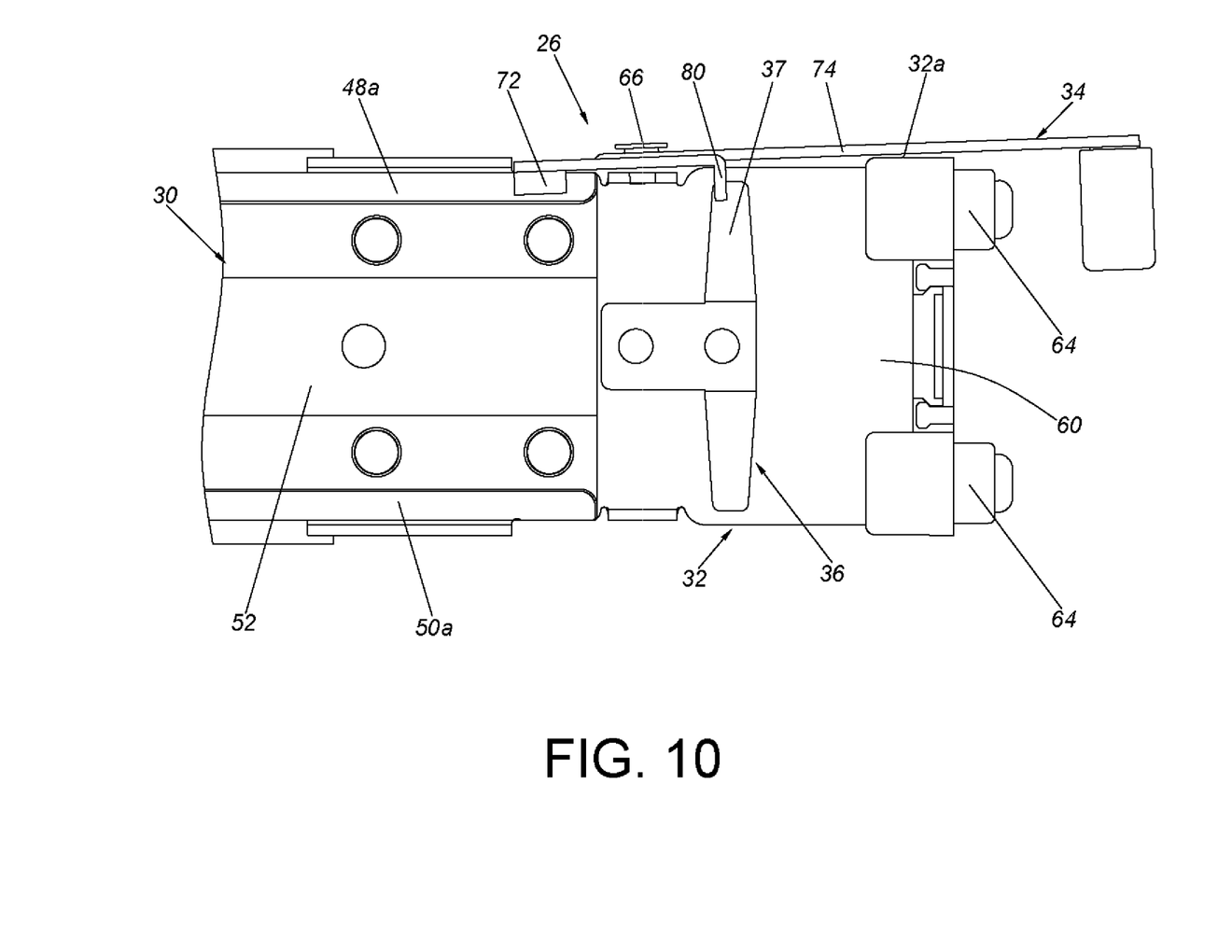
FIG. 10 is a diagram illustrating the fastening member of the bracket device of the slide rail assembly in the predetermined state, and the extension part of the fastening member being raised or deformed due to a force applied according to the embodiment of the present invention.

As shown in FIG. 10, when a force (such as an unintended force) is applied to the extension part 74 of the fastening member 34, the extension part 74 of the fastening member 34 would deform or be raised a height relative to the pin 66. The fastening member 34 and the pin 66 may also be loosened relative to each other due to the tolerance between the fastening member 34 and the pin 66. The extension part 74 would then be extended further out in the height direction relative to the surface of the blocking wall 32a of the bracket 32 (one of the two blocking features), resulting in the surface of the blocking wall 32a of the bracket 32 being unable to block the extension part 74. In this scenario, the surface of the first bending wall 48a of the supporting frame 30 (the other one of the two blocking features) can still be used for blocking by being beside the supporting part 72 of the fastening member 34. In this manner, the fastening member 34 can be prevented from rotating toward the second direction R2 from the predetermined state X.

It can be seen from the aforementioned embodiments according to the present invention that when one of the two blocking features is unable to provide a blocking function, the other of the two blocking features can still prevent the fastening member 34 from rotating in the second direction R2 from the predetermined state X. Therefore, the present invention increases the quality and reliability of the slide rail assembly and the bracket device 26. In other words, the second bracket device 26 comprises a double protective mechanism that can prevent the fastening member 34 from rotating in the second direction R2 from the predetermined state X. It is worth mentioning that the two blocking features of the second bracket device 26 are arranged on the rotation path of the fastening member 34 when the fastening member 34 is rotated from the second direction R2. Therefore, only one of the two blocking features would need to provide a blocking function to prevent the fastening member 34 from rotating in the second direction R2 from the predetermined state X.

It should be noticed that a position where the fastening member 34 is pivotally connected to the lug 70 of the bracket 32 through the pin 66 is not at a center between the supporting part 72 and the extension part 74, i.e., a distance L1 between the position where the fastening member 34 is pivotally connected to the lug 70 of the bracket 32 through the pin 66 and supporting part 72 is smaller than a distance L2 between the position where the fastening member 34 is pivotally connected to the lug 70 of the bracket 32 through the pin 66 and extension part 74. In such configuration, the distance L1 between the position where the fastening member 34 is pivotally connected to the lug 70 of the bracket 32 through the pin 66 and supporting part 72 (i.e., the shorter member) is able to resist a larger unintended force, and the distance L1 between the position where the fastening member 34 is pivotally connected to the lug 70 of the bracket 32 through the pin 66 and supporting part 72 (i.e., the shorter dimension) has a smaller tolerance. As a result, the fastening member 34 of the present invention is better at preventing the fastening member 34 from rotating in the second direction R2 from the predetermined state X.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket device, comprising:
a supporting frame having a first wall, a second wall and a side wall connected between the first wall and the second wall of the supporting frame, wherein the first wall of the supporting frame has a first bending wall;
a bracket comprising a longitudinal wall and a mounting member, the longitudinal wall being integrated with the supporting frame, the mounting member being arranged adjacent to the longitudinal wall, wherein the bracket is fixedly arranged on the supporting frame;
a fastening member movably connected to the bracket, the fastening member comprising a supporting part, an extension part, and a connecting part, the connecting part being between the supporting part and the extension part, and the connecting part being pivotally connected to the bracket through a pin, the extension part comprising a fastening section; and
an elastic member configured to provide an elastic force to the fastening member;
wherein the fastening member is unable to be linearly moved relative to the bracket;
wherein when the fastening member is in a predetermined state, the fastening section is adjacent to the mounting member;
wherein when the fastening member is rotated in a first direction from the predetermined state, the fastening section moves away from the mounting member;
wherein the bracket device further comprises a blocking feature arranged on a rotation path of the fastening member in a second direction along which the fastening member is rotated;
wherein when the fastening member is at the predetermined state, the blocking feature is configured beside the supporting part of the fastening member for preventing the fastening member from rotating in the second direction from the predetermined state;
wherein when the fastening member is at the predetermined state, a surface of the first bending wall of the supporting frame is located beside the supporting part of the fastening member.

2. The bracket device of claim 1, wherein the blocking feature is a wall of the supporting frame or a wall of the bracket.

3. The bracket device of claim 1, wherein the longitudinal wall of the bracket comprises two lateral sides, the fastening member is pivoted to one of the two lateral sides.

4. The bracket device of claim 1, wherein the bracket further comprises an end wall, and when the fastening member is at the predetermined state, the end wall is located between the fastening section and the supporting part.

5. A bracket device, comprising:
a supporting frame;
a bracket comprising a longitudinal wall, an end wall, and a mounting member, the longitudinal wall being integrated with the supporting frame, the mounting member being arranged adjacent to the longitudinal wall, wherein the bracket is fixedly arranged on the supporting frame;
a fastening member movably connected to the bracket, the fastening member comprising a supporting part, an extension part, and a connecting part, the connecting part being between the supporting part and the extension part, and the connecting part being pivotally connected to the bracket through a pin, the extension part comprising a fastening section; and
an elastic member configured to provide an elastic force to the fastening member;
wherein the fastening member is unable to be linearly moved relative to the bracket;
wherein when the fastening member is in a predetermined state, the fastening section is adjacent to the mounting member;
wherein when the fastening member is rotated in a first direction from the predetermined state, the fastening section moves away from the mounting member;
wherein the bracket device further comprises a blocking feature arranged on a rotation path of the fastening member in a second direction along which the fastening member is rotated;
wherein when the fastening member is at the predetermined state, the blocking feature is configured beside the supporting part of the fastening member for preventing the fastening member from rotating in the second direction from the predetermined state;

wherein when the fastening member is at the predetermined state, the end wall is located between the fastening section and the supporting part, wherein the longitudinal wall of the bracket comprises two lateral sides, the fastening member is pivoted to one of the two lateral sides.

6. The bracket device of claim 5, wherein the blocking feature is a wall of the supporting frame or a wall of the bracket.

* * * * *